(12) United States Patent
Webster et al.

(10) Patent No.: US 6,579,168 B1
(45) Date of Patent: Jun. 17, 2003

(54) BACK-UP DC VENT SYSTEM FOR EQUIPMENT ENCLOSURE

(75) Inventors: James W. Webster, Bensenville, IL (US); Marvin P. Garcia, Lizol Stream, IL (US)

(73) Assignee: Marconi Communications, Inc., Cleveland, OH (US)

( * ) Notice: Subject to any disclaimer, the term of this patent is extended or adjusted under 35 U.S.C. 154(b) by 0 days.

(21) Appl. No.: 10/038,637

(22) Filed: Jan. 3, 2002

(51) Int. Cl.[7] .................................................. H05K 5/00
(52) U.S. Cl. ........................ 454/184; 361/687; 361/695
(58) Field of Search ........................... 454/184; 361/687, 361/695, 694

(56) References Cited

U.S. PATENT DOCUMENTS 5,479,341 A * 12/1995 Pihl et al. ..................... 700/79
5,485,878 A    1/1996 Derks
6,000,623 A * 12/1999 Blatti et al. ................. 236/49.3
6,105,875 A    8/2000 LaGrotta et al.
6,164,369 A * 12/2000 Stoller .................... 165/104.33
6,181,557 B1   1/2001 Gatti
6,453,378 B1 * 9/2002 Olson et al. ................. 710/304

* cited by examiner

Primary Examiner—Derek S. Boles
(74) Attorney, Agent, or Firm—Jones Day

(57) ABSTRACT

A backup DC vent system for an equipment enclosure is disclosed. The system includes an air intake system which allows air to pass from the ambient environment through a battery compartment of the enclosure, through the floor and into the interior of the enclosure where components to be cooled are mounted. Internal air distribution is accomplished by an air distribution duct system. An air exhaust system is attached to a side of the enclosure and includes a door panel to selectively allow heated air flow from the enclosure interior, a fan mounted to a fan box which is mounted to the enclosure for sucking the air through the enclosure, and a cover to prevent wind driven rain water from impinging upon the fan or the interior of the enclosure.

15 Claims, 6 Drawing Sheets

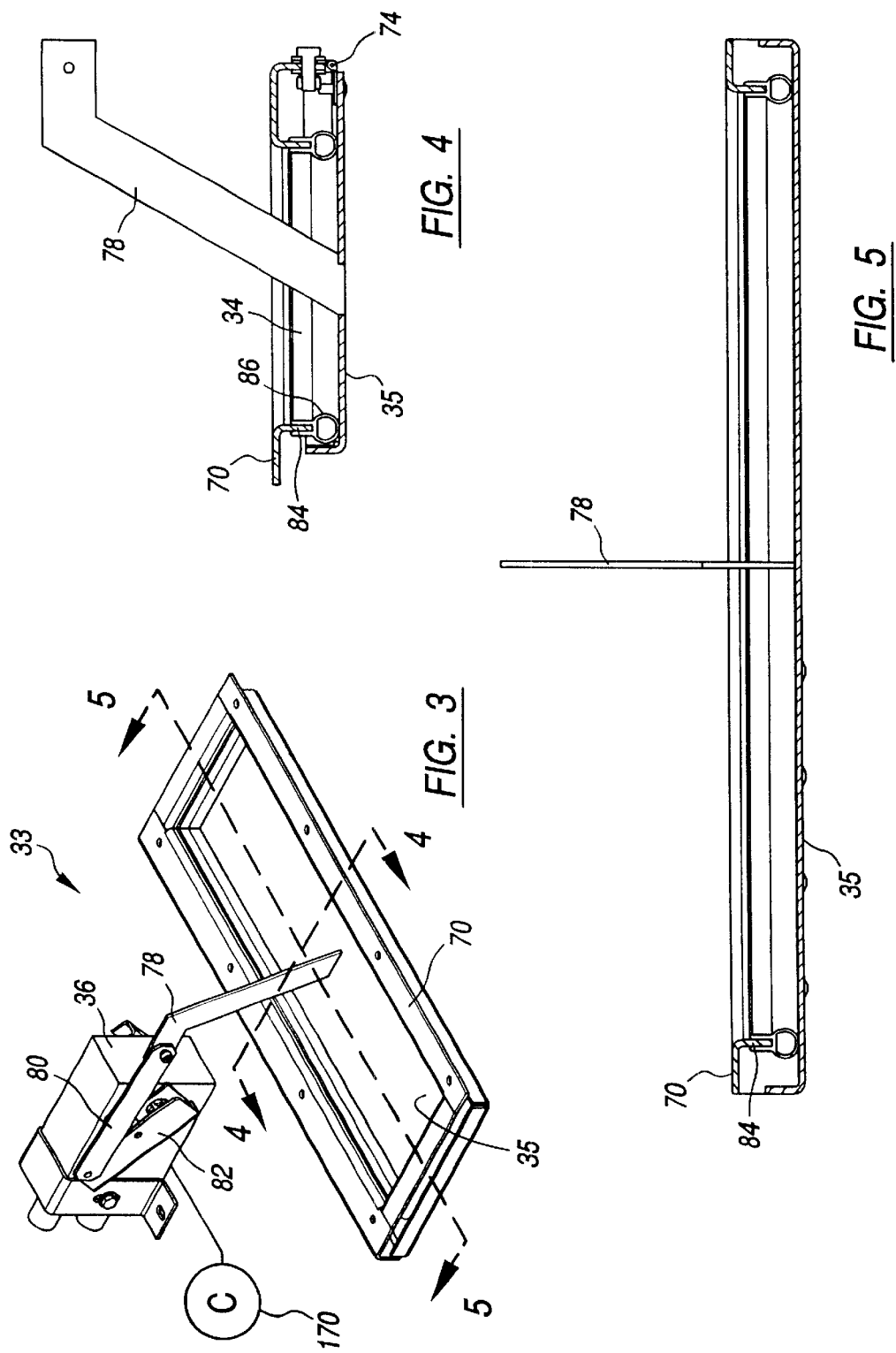

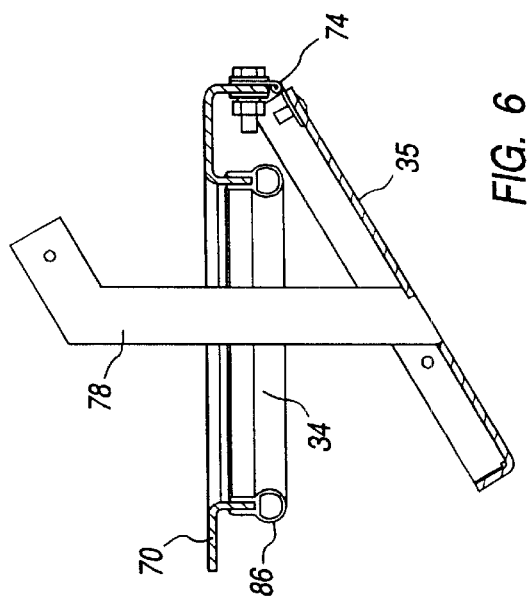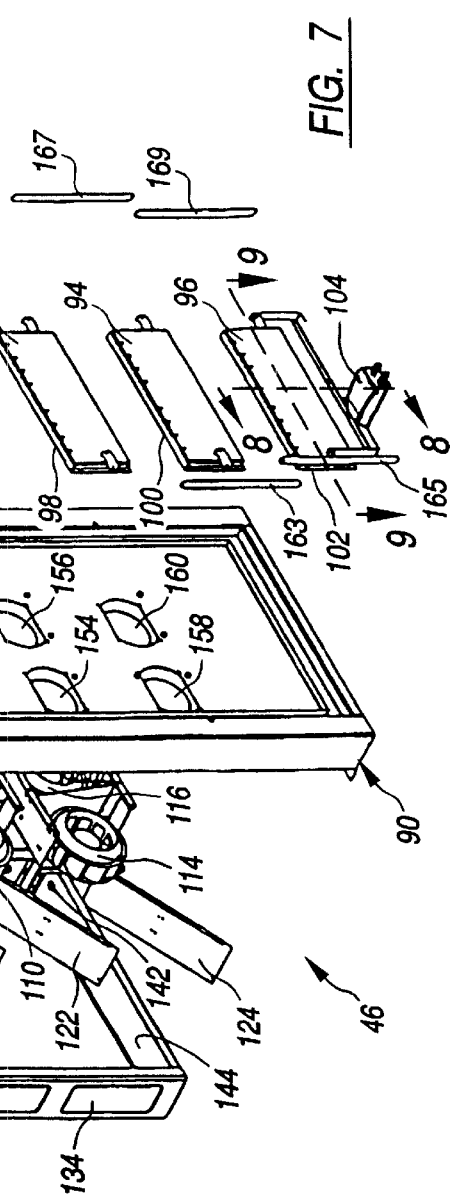

BACK-UP DC VENT SYSTEM FOR EQUIPMENT ENCLOSURE

BACKGROUND OF THE INVENTION

1. Field of the Invention

The present invention relates to a backup DC vent system for an equipment enclosure and more particularly, to an efficient, reliable and low cost backup DC vent system for an equipment enclosure, especially a modular enclosure, in the event of an air conditioner malfunction or a loss of community power.

2. Description of the Related Art

Telecommunication equipment enclosures often include components which need heat management. Usually such equipment enclosures are equipped with an air conditioning system operating on community power to ensure that the components are maintained within a predetermined temperature range. A problem arises, however, when the air conditioning system malfunctions, when there are abnormal heat conditions or when there is a loss of community power. If there is a loss of community power, batteries continue to power the components to maintain customer service, however, these components continue to need heat management. A backup air conditioning system is often too costly, requires a lot of energy and consumes too much scarce space.

Fan/shutter systems for cooling equipment enclosures are known. For example, reference is made to U.S. Pat. No. 6,181,557 ("the '557 patent"). The '557 patent discloses a fan cooling system which incorporates pressure/gravity operated shutters or dampers. When a fan is operating, pressure opens the shutter; when the fan ceases operation or malfunctions, the shutter will close due to gravity in the absence of air pressure from the fan. While such a system provides some cooling, it also unduly exposes the components within the equipment enclosure to undesirable salt fog, wind driven rain, dust, humidity and other airborne contaminants. U.S. Pat. No. 6,105,875 discloses direct air cooling of an outdoor cabinet but again unduly exposes the components to contaminants. U.S. Pat. No. 5,485,878 discloses an air conditioning system using ambient air via a motorized vent, however, if community power fails, it fails to operate. An effective and efficient backup vent system for equipment enclosures is still lacking.

BRIEF SUMMARY OF THE INVENTION

The difficulties disclosed above have been overcome by the present invention. What is described here is a backup vent system for an equipment enclosure comprising an enclosure having an interior space adapted to contain components to be cooled, an air intake system including a first opening, a first movable panel for opening and closing the opening, a seal around the opening when the panel closes the opening, and a first actuator for moving the first panel and for maintaining a closing pressure on said first panel, and an air exhaust system including a second opening, a second panel for opening and closing the second opening, a seal around the second opening when the second panel closes the second opening, and a second actuator for moving the second panel and for maintaining a closing pressure on the second panel.

There are a number of advantages, features and objects achieved with the present invention which are believed not to be available in earlier related devices. For example, one advantage is that the present invention provides a low power DC vent system to control temperature in an equipment enclosure. The system allows for modular growth and uses little extra space. Another object of the present invention is to provide a backup DC vent system which blocks pollutants such as wind driven rain, dust, humidity and salt fog from electronic equipment located within the equipment enclosure. This is achieved by bulb seals and sufficient seal pressure. A further advantage of the present invention is the provision of a backup DC vent system which is inexpensive, simple and reliable.

A further feature of the present invention is to provide a backup DC vent system which may be used when community power is low, a brown out condition, or off, a blackout condition, or when there is a failure of an air conditioning system or when the air conditioning system needs help because of unusual temperature conditions. Yet another object of the present invention is to provide a backup DC vent system which does not interfere with the operation of the enclosures and its contents under normal conditions and does not cause degradation of the components mounted within the enclosure. Still a further advantage of the present invention is the provision of a backup DC vent system having an air distribution system that is also used by an air conditioning system under normal operation.

A more complete understanding of the present invention and other objects, advantages and features thereof will be gained from a consideration of the following description of a preferred embodiment read in conjunction with the accompanying drawing provided herein. The preferred embodiment described below represents an example of the invention which is described here in compliance with Title 35 U.S.C. section 112 ($1^{st}$ paragraph), but the invention itself is defined by the attached claims.

BRIEF DESCRIPTION OF THE SEVERAL VIEWS OF THE DRAWING

FIG. 3 is an isometric view of a closed air intake system.

FIG. 4 is an enlarged sectional side elevation view of the air intake system taken along line 4—4 of FIG. 3.

FIG. 5 is an enlarged sectional front elevation view of the air intake system taken along line 5—5 of FIG. 3.

FIG. 6 is a sectional side elevation view similar to that shown in FIG. 4 but showing the air intake system in an open position.

FIG. 7 is an exploded isometric view of a closed air exhaust system.

DETAILED DESCRIPTION OF A PREFERRED EMBODIMENT OF THE INVENTION

Figure 1:
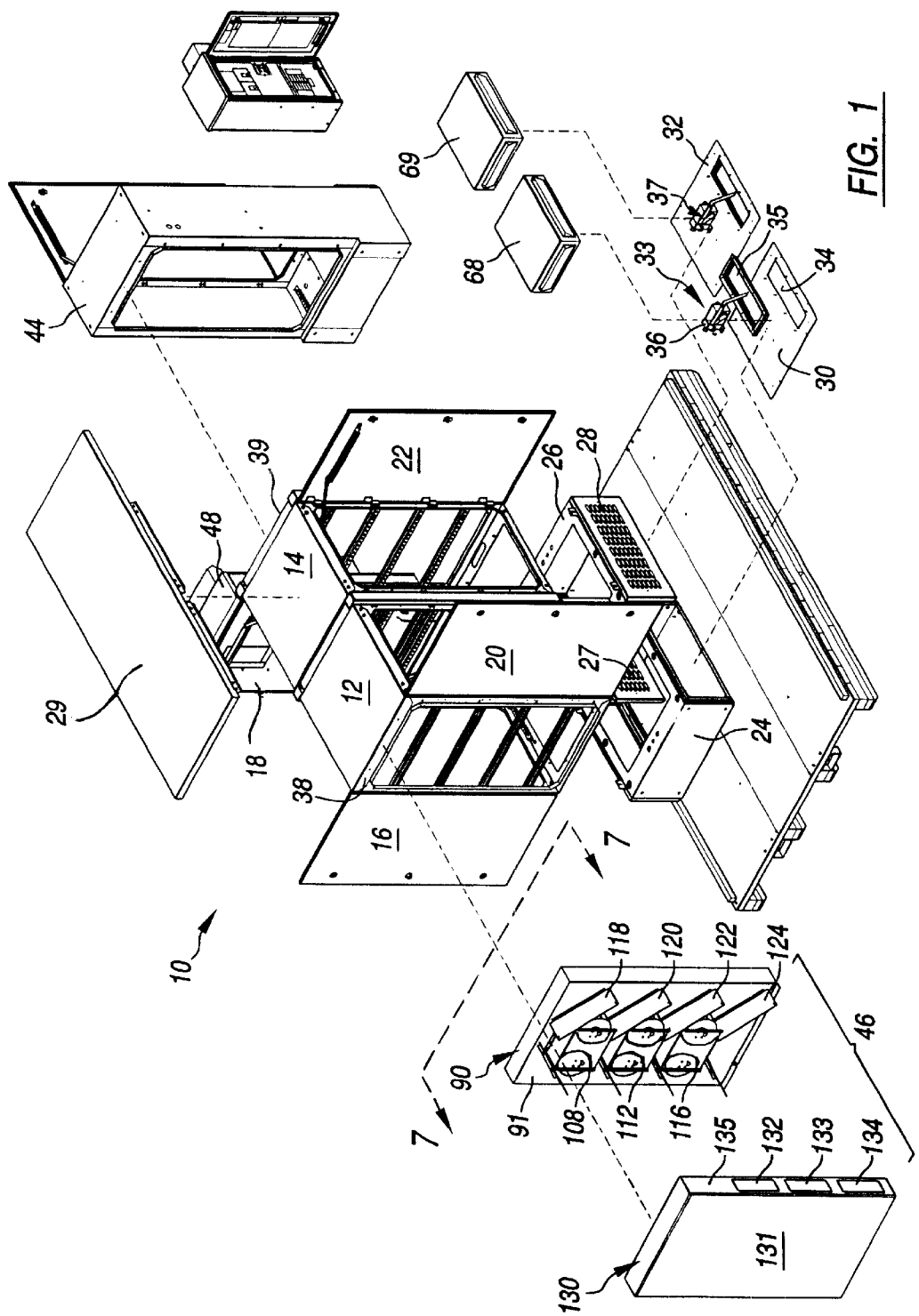
FIG. 1 is an exploded isometric view of an enclosure having a backup DC vent system.

While the present invention is open to various modifications and alternative constructions, the preferred embodiment shown in the drawing will be described herein in detail. It is understood, however, that there is no intention to limit the invention to the particular form or example disclosed herein. On the contrary, the intention is to cover all modifications, equivalent structures and methods, and alternative constructions falling within the spirit and scope of the invention as expressed in the appended claims, pursuant to Title 35 U.S.C. § 112 ($2^{nd}$ paragraph).

Referring now to FIG. 1, there is illustrated an equipment enclosure 10 having two aligned cages 12, 14. Each cage has a front door 16, 18 and a rear door 20, 22. Beneath each cage is a battery compartment 24, 26 which is open to ambient air through air intake louvers 27, 28. A top panel 29 covers and insulates the cages. Each cage has a floor panel, such as the floor panel 30 for the cage 12 and the floor panel 32 for the cage 14. An air intake system 33 including an opening 34 in the floor panel 30, a movable door panel 35 to open and close the opening and an actuator 36 to move the door panel is configured to fit in the bottom of the cage 12. A similar air intake system 37 is configured for the cage 14. The cage 12 includes a left side 38 and the cage 14 includes a right side 39.

The cages are sealed together in a side by side arrangement. A side cabinet 44 is mounted to the right side 39 and an air exhaust system 46 is mounted to the left side 38. It is to be understood that while two connected cages are shown for purposes of this disclosure, a single cage or three or more cages may be used. Indeed, the enclosure is modular for future growth. An air conditioning system 48 is mounted to the front door 18 of the enclosure to provide a managed temperature for thr components mouted within the cages. The doors, side cabinet and air exhaust system are all sealed to the cages to prevent contaminants and other harmful material from entering the interior of the cages. In this way, the enclosure provides a sealed environment for the components mounted within.

Figure 2:
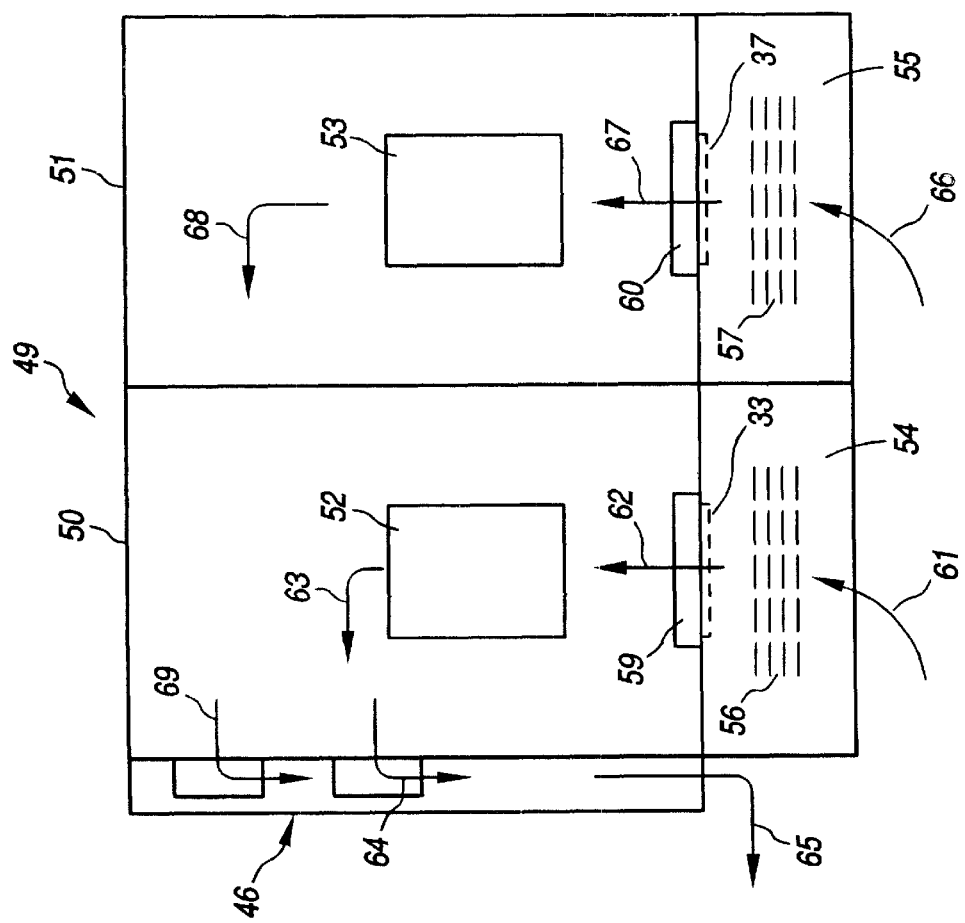
FIG. 2 is a diagrammatic view of air flow paths through the enclosure when the DC vent system is operating.

To help understand the simplicity of the disclosure here, reference is made to FIG. 2 which illustrates in diagrammatic form the operation of the backup DC vent system. If the air conditioning system 48 is unable to cool the components sufficiently, due to very hot weather, a brown out or a black out, for example, the backup DC vent system will activate. Shown in FIG. 2 is an enclosure 49 formed of two cages 50, 51, each containing electrical components 52, 53 to be cooled. The cages are mounted on top of battery compartments 54, 55 and each has a set of louvers 56, 57. The air intake systems 33, 37 are mounted above the battery compartments and the air exhaust system 46 is mounted on the left. Air distribution duct systems 59, 60 are mounted above the air intake systems 33, 37, respectively. Arrows 61, 62, 63, 64, 65, illustrate an air flow path through the cage 50, and arrows 66, 67, 68, 69 and 65 illustrate an air flow path through the cage 51. When a pre-determined temperature is reached in the cages, the backup DC vent air flow begins. Floor and wall door panels of the intake and exhaust systems, respectively, open to the ambient and fans activate to suck ambient air.through the battery compartments and into the cages before being exhausted back to the ambient. A sufficient air flow may be created to maintain the temperature within the enclosure to about 6.5° C. above ambient.

Referring now to FIGS. 3 and 4, there is illustrated in detail the air intake system 33. The air intake assembly includes a frame 70 which is connected to the floor panel 30, FIG. 1 around the opening 34. The air intake assembly also includes the movable door panel 35 which is pivoted to the frame by a hinge 74. The actuator 36 is mounted within the cage and is connected to the panel door 35 by first, second and third links 78, 80, 82. The links are pivoted to each other and the third link 82 is rotated by the actuator. The actuator causes the panel to move between a closed position shown in FIGS. 3, 4, and 5 and an open position shown in FIG. 6.

Referring to FIGS. 4, 5 and 6, the frame 70 includes a depending flange 84 to which is mounted a continuous bulb seal 86. When the door panel 35 is closed, the actuator maintains a pressure of about 35 inch/pounds whereby the door panel squeezes the seal by about a third to insure that the interior of the enclosure is kept air tight.

Referring now to FIGS. 1 and 7, the air exhaust system 46 is shown in left and right facing exploded views. Mounted to the left side 38 of the cage 12 is a fan box 90 having a wall 91. Attached to the inside of the wall 91 are three door panels 92, 94, 96, corresponding frames 98, 100, 102 and an actuator 104. Attached to the outside of the wall 91 are six fans 106, 108, 110, 112, 114, 116, eight baffles of which four baffles 118, 120, 122, 124 are shown clearly and a fan mounting structure 126. Covering the fans, baffles and mounting structure is a cover 130.

The cover 130 has a shield wall 131 and six lateral openings of which three openings 132, 133, 134 are shown on a lateral wall 135. Similar openings may be arranged on the opposite lateral wall 136. Clamping devices, such as the clamp 138, are provided to attach screens (not shown) over the openings to prevent insects and other contaminants from entering the fan box or the interior space of the enclosure.

It may now be appreciated that the shield wall 131 of the cover and the baffles prevent wind driven rain and other contaminants from impinging directly upon the fans. Thus, when the backup DC vent system is operating, wind driven rain, even of hurricane velocity, which might normally impinge upon the fans is prevented from doing so. If the ambient wind is perpendicular to the lateral openings, it will pass through the openings in both lateral walls and not create an undesirable pressure drop or force contaminants through the fan into the enclosure. A drain opening 142 is provided in a bottom wall 144 of the cover so that any wind driven rain entering the fan cover will drain away. The fan box includes six fan openings 150, 152, 154, 156, 158, 160 adjacent to the six fans on one side of the wall 91 and the three frame/door panels on the other side. When the door panels are opened a direct air flow path is formed from the interior of the enclosure, past the door panels, through the fan openings, past the fans and out of the lateral openings of the cover.

Figure 8:
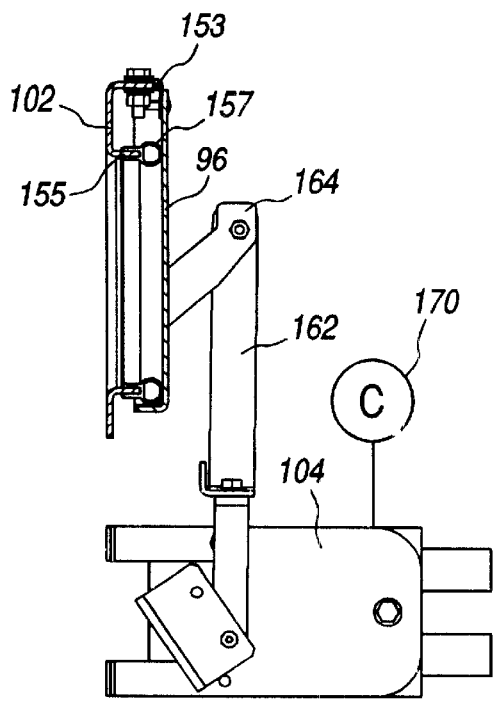
FIG. 8 is an enlarged sectional side elevation view taken along line 8—8 of FIG. 7.
Figure 9:
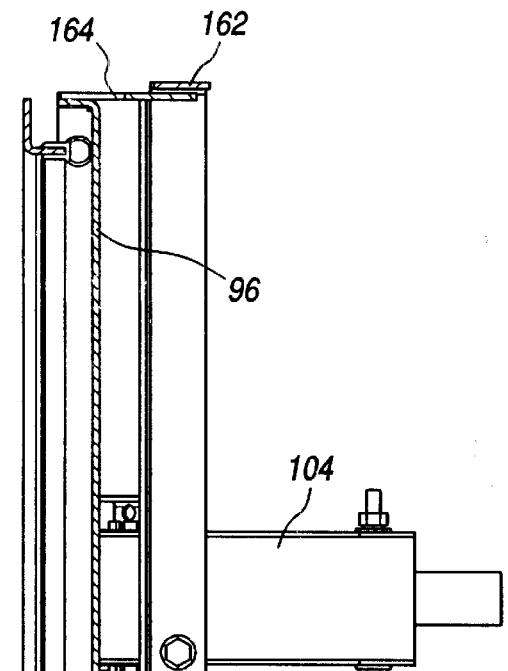
FIG. 9 is an enlarged sectional front elevation view taken along line 9—9 of FIG. 7.
Figure 10:
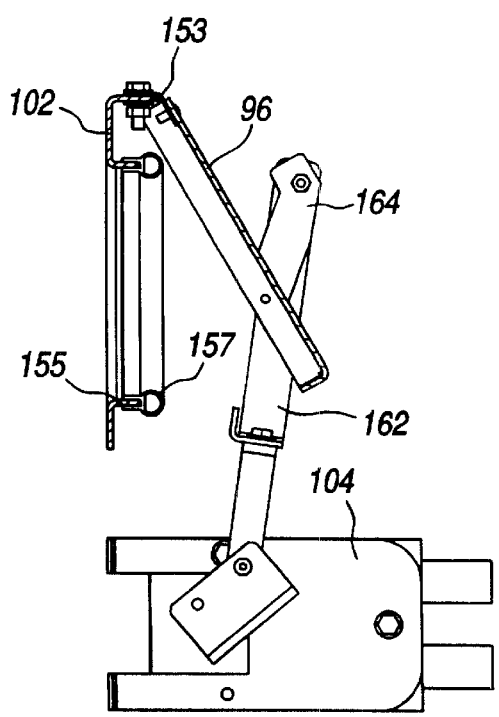
FIG. 10 is a sectional side elevation view similar to FIG. 8 but showing the air exhaust system in an open position.

Referring now to FIGS. 8, 9 and 10, a frame, a door panel and the actuator for the air exhaust system are shown in more detail. In construction they are very similar to the air intake system in that the frame 102 is attached to the inside of the wall 91 FIG. 7 of the fan box 90 adjacent the openings 158, 160. The door panel 96 is connected to the frame by a hinge 153. The frame includes an extending flange 155. A continuous bulb seal 157 extends around the flange and is squeezed by the door panel when the door panel is closed as shown in FIGS. 8 and 9, so that an air tight seal is provided.

Also, as with the air intake system, the actuator 104 is connected to links 162, 164 as shown, enabling the door panel to be moved between open and closed positions. The open position is illustrated in FIG. 10. Additional links 163, 165, 167, 169, FIG. 7, are provided to move the door panels 92, 94 at the same time as the door panel 96 is moved by the actuator. As with the air intake system, the bulb seal requires approximately 35 inch-pounds of pressure to compress approximately 33 percent.

A control 170, FIGS. 3 and 8, having sensors and a processor is mounted within the enclosure to control the fans and all of the door panels. Power for the control, the fans and the actuators come from either an internal rectified source or batteries in the battery compartments. The control activates the fans and the actuators in the event of a power loss and high temperature or an air conditioning failure and high temperatures. In this manner the temperature within the enclosure will remain relatively close to the ambient temperature, within 5–7° C., and this may be accomplished without unnecessarily exposing the components within the enclosure to high risks of humidity, water and dust.

Figure 11:
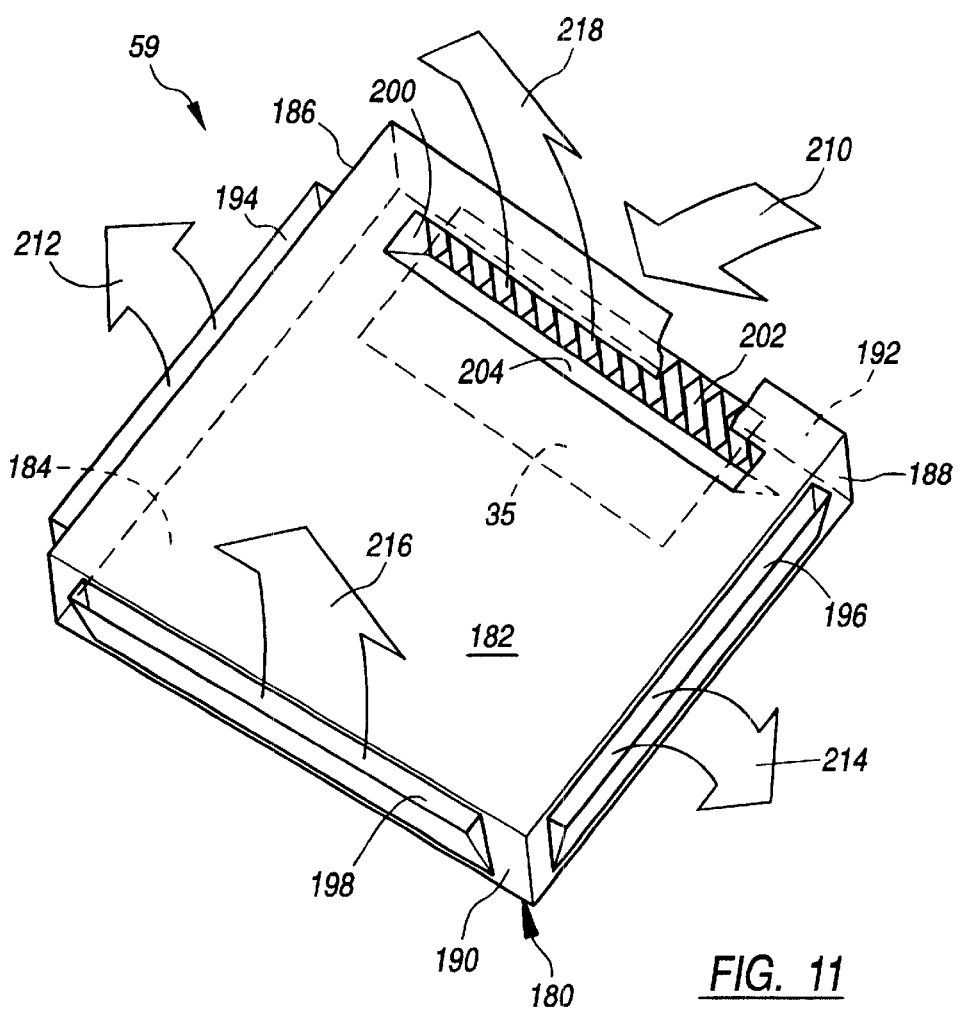
FIG. 11 is a partially broken-away, diagrammatic, isometric view of an air distribution duct system.

Referring now to FIG. 11, the air distribution duct system 59 is shown in more detail. The system includes a receptacle 180 having a top wall 182, a bottom wall 184, a first side wall 186, a second side wall 188, a rear wall 190 and a front opening 192. A first vent 194 is formed in the side wall 186, a second vent 196 in the side wall 188 and a third vent 198 in the rear wall 190. Further, a fourth vent 200 is formed in the top wall 182. Internal adjustable vanes 202 are positioned in the front opening 192 to direct air to the four vents. A depending flap 204 in the top wall also helps direct air to the fourth vent 200. The receptacle also is positioned over the door panel 35, FIG. 1 of the air intake system 33.

The air distribution system receives air from the air conditioning system or the backup DC vent system, or perhaps both in brown out conditions, for predetermined air direction to efficiently and effectively direct cooling air to the components in the enclosure to be cooled.

In a diagrammatic manner the air flow distribution is shown with a series of arrows. The arrow 210 represents intake air from the air conditioning unit or from the air intake system of the backup DC vent system. Thus, the air distribution system operates whether the enclosure is being cooled by the air conditioning system or whether the backup system is being used. The internal vanes and the flap direct the intake air to the side and rear vents and to the top vent in a predetermined manner. The exiting air from the side vents is illustrated by the arrows 212, 214, the exiting air from the rear vent is illustrated by the arrow 216 and the exiting air from the top vent is illustrated by the arrow 218.

It is to be understood that the backup DC vent system is, under normal circumstances, closed and sealed thereby protecting the components in the interior of the enclosure in the same way the front and rear doors seal the interior of the enclosure. It is well known that enclosures are built to seal the sensitive electronic components within the enclosure from detrimental environmental elements such as high humidity, salt fog, contamination, rain borne water, dust and the like. The door panels of the backup DC vent system open only when a predetermined condition is reached and even then, the interior of the enclosure is well protected from contamination because of the placement of the air intake system and the use of the cover 130. This is true even under high wind conditions.

The backup DC vent system is relatively inexpensive, reliable and relatively simple. Further, the backup DC vent system uses little power, little space, and does not detract from the typical use of the equipment enclosures. Yet the system protects the enclosure interior in a usual way when not activated. The backup DC vent system is also modular in that as extra cage space may be added to an enclosure without difficulty. When a new cage is added, another air intake system is placed in the floor panel and another set of fans is added to the fan box, if needed. Furthermore, the backup DC vent system obviates the need for an expensive backup air conditioning system. Also, in the event that DC power is lost during use of the backup DC vent system, springs (not shown) in the actuators will return the door panels to their closed position in less than 30 seconds. This ensures that the backup DC vent system will never remain open when not actually in use.

It has been found in one test that a fully configured system has the capability of removing up to the 3200 watts of heat from an enclosure while maintaining a temperature differential no higher than 6.5° C. above ambient because of the high volume and velocity of air sent through the enclosure by the backup DC vent system.

As an example of an operating profile, where normal operating temperature is between 65 and 95° F., the system may be monitored and programmed by the control to actuate a heater at 63° F. and a low temperature alarm at 60° F. At 45° F. the equipment may be shut down and an alarm sent. Going up the temperature scale, the equipment heater may be turned off at 77° F. and at 85° F. the air conditioning system switched on. At a 100° F. a high temperature alarm may be sent and at 105° F. the backup DC vent system activates and an alarm is sent. Finally, at a 118° F. the equipment may be shut down and another alarm sent. Also, at 118° F. the backup DC vent system closes all door panels.

The portion of the specification above describes in detail a preferred embodiment of the present invention. Other examples, embodiments, modifications and variations will under both the literal claim language and under the doctrine of equivalents come within the scope of the invention defined by the appended claims. For example, using more or less fans or fans-of different capacities, or changing the dimensions of the openings or the force applied by the actuators, are all considered equivalent structures and will also come within the literal language of the claims. Still other alternatives will also be equivalent as will many new technologies. There is no desire or intention here to limit in any way the application of the doctrine of equivalents nor to limit or restrict the scope of the invention.

What is claimed is:

1. A backup vent system for an equipment enclosure comprising:

an enclosure having an interior space adapted to contain components to be cooled;

an air intake system including a first opening, a first movable panel for opening and closing said opening, a first seal around said first opening when said first panel closes said first opening, and a first actuator for moving said first panel and for maintaining a closing pressure on said first panel; and an air exhaust system including a second opening, a second panel for opening and closing said second opening, a second seal around said second opening when said second panel closes said second opening, and a second actuator for moving said second panel and for maintaining a closing pressure on said second panel.

2. An apparatus as claimed in claim 1 including:

said air exhaust system includes a selectively operated fan connected to said enclosure adjacent said second opening; and said air exhaust system includes a cover connected to said enclosure for shielding said fan and said second opening, said cover allowing for exhaust air to pass to an ambient environment outside the enclosure.

3. An apparatus as claimed in claim 2 wherein:

said first and said second movable panels are closed when said fan is not operating and said first and said second movable panels open said first and said second openings, respectively, when said fan is activated.

4. An apparatus as claimed in claim 3 wherein:

said first seal is positioned around said first opening; and said second seal is positioned around said second opening.

5. An apparatus as claimed in claim 4 wherein:

said first and said second seals are of the bulb type.

6. An apparatus as claimed in claim 3 including:

a control for opening and closing said first and said second movable panels and for activating said fan.

7. An apparatus as claimed in claim 2 wherein:

said cover includes side and bottom openings for preventing wind driven rain water from impinging on said exhaust fan and for draining water.

8. An apparatus as claimed in claim 2 wherein:

said enclosure includes a battery compartment with walls having air intake openings;

said enclosure includes a bottom wall to which said air intake system is connected; and said enclosure includes a side to which said air exhaust system is connected.

9. An apparatus as claimed in claim 1 including:

an air distribution duct system.

10. A DC vent system for an equipment enclosure comprising:

an enclosure having an interior, a first wall with an opening for passing ambient air into said interior, a second wall with an opening for passing heated air out of the interior, said interior adapted to contain components to be cooled;

a first movable panel connected to said enclosure and positioned to open and close the opening in said first wall;

a second movable panel connected to said enclosure and positioned to open and close the opening in said second wall;

a first seal between said first panel and said opening of said first wall;

a second seal between said second panel and said opening of said second wall;

a fan connected to said enclosure and mounted adjacent the opening in said second wall;

a cover connected to said enclosure and positioned to shield said fan;

a first actuator connected to said enclosure for moving said first panel between open and closed positions;

a second actuator connected to said enclosure for moving said second panel between open and closed positions; and a control connected to said enclosure for sensing temperature in said interior and for activating said first and said second actuators and said fan when said temperature reaches a predetermined level.

11. An apparatus as claimed in claim 10 wherein:

said first seal is placed around a first frame surrounding the opening in said first wall; and said second seal is placed around a second frame surrounding the opening in said second wall.

12. An apparatus as claimed in claim 11 wherein:

said first seal is a bulb seal; and said second seal is a bulb seal.

13. An apparatus as claimed in claim 10 wherein:

said cover includes side and bottom openings.

14. An apparatus as claimed in claim 10 wherein:

said enclosure includes a battery compartment with walls having air intake openings.

15. An apparatus as claimed in claim 10 wherein:

said first and said second movable panels are closed when said fan is not operating and said first and said second movable panels open said first and said second openings, respectively, when said fan is activated.

* * * * *